United States Patent
Chen et al.

(10) Patent No.: US 9,991,478 B2
(45) Date of Patent: Jun. 5, 2018

(54) METHODS FOR FABRICATING AN ORGANIC ELECTRO-LUMINESCENCE DEVICE AND FLEXIBLE ELECTRIC DEVICE

(71) Applicant: Industrial Technology Research Institute, Hsinchu (TW)

(72) Inventors: Cheng-Yi Chen, Taichung (TW); Chao-Feng Sung, Hsinchu (TW); Jyun-Kai Ciou, Changhua County (TW); Yung-Min Hsieh, Hsinchu County (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days. days.

(21) Appl. No.: 15/361,004

(22) Filed: Nov. 24, 2016

(65) Prior Publication Data

US 2017/0077463 A1  Mar. 16, 2017

Related U.S. Application Data

(63) Continuation-in-part of application No. 14/953,428, filed on Nov. 30, 2015, now Pat. No. 9,882,173.

(Continued)

(51) Int. Cl.
*H01L 51/56* (2006.01)
*H01L 51/52* (2006.01)
*H01L 51/00* (2006.01)

(52) U.S. Cl.
CPC .......... *H01L 51/56* (2013.01); *H01L 51/0011* (2013.01); *H01L 51/0014* (2013.01);
(Continued)

(58) Field of Classification Search
CPC . H01L 51/56; H01L 51/0011; H01L 51/0014; H01L 51/0023; H01L 51/5203; H01L 51/5246
(Continued)

(56) References Cited

U.S. PATENT DOCUMENTS 8,029,964 B1  10/2011  Almanza-Workman et al.
8,596,509 B2  12/2013  Kim et al.
(Continued)

FOREIGN PATENT DOCUMENTS

CN  101861663  10/2010
CN  103872084  6/2014
(Continued)

OTHER PUBLICATIONS

"Office Action of Taiwan Counterpart Application," dated Mar. 30, 2017, p. 1-p. 5.
(Continued)

*Primary Examiner* — Mohsen Ahmadi
*Assistant Examiner* — Patricia Reddington
(74) *Attorney, Agent, or Firm* — JCIPRNET

(57) ABSTRACT

A method for fabricating an organic electro-luminescence device, comprising: forming a first conductive layer comprising a first electrode and a contact pattern on a substrate; forming a first mask on the first conductive layer, the first mask comprising an opening for exposing a portion of the first electrode and a portion of the contact pattern; forming a patterned organic functional layer by shielding of a second mask, the patterned organic functional layer covering the first mask and the first electrode exposed by the first mask, and the second mask being disposed over the first mask to shield the portion of the contact pattern exposed by the opening; forming a second conductive layer and patterning the second conductive layer by removing the first mask and
(Continued)

a portion of the second conductive layer on the first mask to form a second electrode electrically connected to the contact pattern.

21 Claims, 15 Drawing Sheets

Related U.S. Application Data

(60) Provisional application No. 62/140,474, filed on Mar. 31, 2015.

(52) U.S. Cl.
CPC ...... *H01L 51/0023* (2013.01); *H01L 51/5203* (2013.01); *H01L 51/5246* (2013.01); *H01L 51/5253* (2013.01); *H01L 2251/5338* (2013.01); *H01L 2251/5392* (2013.01)

(58) Field of Classification Search
USPC .......................................................... 438/64
See application file for complete search history.

(56) References Cited

U.S. PATENT DOCUMENTS

| | | | |
|---|---|---|---|
| 8,674,377 | B2 | 3/2014 | Farquhar |
| 8,912,018 | B2 | 12/2014 | Burrows et al. |
| 2007/0138952 | A1 | 6/2007 | Liu et al. |
| 2008/0038986 | A2 | 2/2008 | Lee et al. |
| 2008/0079891 | A1* | 4/2008 | Shin .................. C08G 59/4035 349/153 |
| 2009/0267507 | A1* | 10/2009 | Takashima .......... H01L 51/0011 313/511 |
| 2009/0274830 | A1 | 11/2009 | White et al. |
| 2010/0320909 | A1* | 12/2010 | Izumi .................. H01L 27/3246 315/51 |
| 2013/0277645 | A1 | 10/2013 | Antonenkov |

FOREIGN PATENT DOCUMENTS

| | | |
|---|---|---|
| CN | 204569798 | 8/2015 |
| TW | 201331394 | 8/2013 |
| TW | 201400578 | 1/2014 |
| TW | 201526327 | 7/2015 |

OTHER PUBLICATIONS

Mark Dai Joong Aucha, et al., "Ultrathin glass for flexible OLED application," Thin Solid Films, vol. 417, Issues 1-2, Sep. 30, 2002, pp. 47-50.

Su Shen, et al., "Microlens array film fabricated by UV roll-to-roll nanoimprinting for enhancing out-coupling efficiency of organic light-emitting devices," 2012 International Conference on Manipulation, Manufacturing and Measurement on the Nanoscale (3M-NANO), Aug. 29-Sep. 1, 2012, pp. 165-168.

Akira Sugimoto, et al., "Flexible OLED Displays Using Plastic Substrates," IEEE Journal of Selected Topics in Quantum Electronics, vol. 10, No. 1, Jan./Feb. 2004, pp. 107-114.

Jukka Hast, et al., "Freeform and flexible electronics manufacturing using R2R printing and hybrid integration techniques," 2014 44th European Solid State Device Research Conference (ESSDERC), Sep. 22-26, 2014, pp. 198-201.

Jukka Hast, et al., "Roll-to-Roll Manufacturing of Printed OLEDs," SID Symposium Digest of Technical Papers, vol. 44, Issue 1, Jun. 2013, pp. 192-195.

* cited by examiner

METHODS FOR FABRICATING AN ORGANIC ELECTRO-LUMINESCENCE DEVICE AND FLEXIBLE ELECTRIC DEVICE

CROSS-REFERENCE TO RELATED APPLICATION

This application is a continuation-in-part application of U.S. application Ser. No. 14/953,428, filed on Nov. 30, 2015, which claims the priority benefits of U.S. provisional application Ser. No. 62/140,474, filed on Mar. 31, 2015. The entirety of each of the above-mentioned patent applications is hereby incorporated by reference herein and made a part of this specification.

BACKGROUND

Technical Field

The present disclosure generally relates to a roll-to-roll process, in particular, to a method for fabricating a flexible electric device.

Description of Related Art

Organic electro-luminescent devices having high quantum efficiency and low power consumption are widely utilized in display and illumination fields. Since organic electro-luminescent devices are advantaged in light-weight and nice color rendering, organic electro-luminescent devices are considered as a mainstream of next generation displays and illumination devices. Currently, fabrication cost of organic electro-luminescent devices cannot be reduced easily, and different roll-to-roll processes and apparatuses designed for mass production are proposed accordingly. However, the aforesaid roll-to-roll processes for fabricating organic electro-luminescence devices suffers serious alignment issue (i.e. mis-alignment between stacked layers of the fabricated organic electro-luminescence devices occurs) which causes low yield rate. Accordingly, solutions for resolving the alignment issue during the roll-to roll processes are required.

SUMMARY

Accordingly, the present disclosure is directed to a method for fabricating an organic electro-luminescence device.

A method for fabricating an organic electro-luminescence device, comprising: forming a first conductive layer on a substrate, the first conductive layer comprising a first electrode and a contact pattern electrically insulated from the first electrode; forming a first mask on the first conductive layer, the first mask comprising an opening for exposing a portion of the first electrode and a portion of the contact pattern, and a viscosity of an adhesion film of the first mask being substantially equal to or greater than 2000 g/inch; forming a patterned organic functional layer by shielding of a second mask, the patterned organic functional layer covering the first mask and the first electrode exposed by the first mask, and the second mask being disposed over the first mask to shield the portion of the contact pattern exposed by the opening; removing the second mask after forming the patterned organic functional layer; forming a second conductive layer over the patterned organic functional layer, the first mask and the contact pattern exposed by the opening; and patterning the second conductive layer by removing the first mask and a portion of the second conductive layer on the first mask to form a second electrode electrically connected to the contact pattern.

A method for fabricating an organic electro-luminescence device, comprising: forming a first conductive layer on a substrate, the first conductive layer comprising a first electrode and a contact pattern electrically insulated from the first electrode; forming a first mask over the first conductive layer, the first mask comprising a first opening for exposing a portion of the first electrode and a portion of the contact pattern; forming a second mask on the first mask, the second mask comprising a second opening, the second mask shielding the contact pattern exposed by the first opening and the second opening exposing a portion of the first electrode, wherein an adhesion between the first conductive layer and the first mask and an adhesion between the first mask and the second mask are substantially equal to or greater than 2000 g/inch; performing a cleaning process on the substrate having the first conductive layer, the first mask and the second mask formed thereon; forming a patterned organic functional layer on the first electrode by shielding of the second mask; decreasing the adhesion between the first conductive layer and the first mask and the adhesion between the first mask and the second mask after performing the cleaning process; removing the second mask after forming the patterned organic functional layer; forming a second conductive layer over the patterned organic functional layer, the first mask and the contact pattern; and patterning the second conductive layer by removing the first mask and a portion of the second conductive layer on the first mask to form a second electrode electrically connected to the contact pattern.

A method for fabricating a flexible electric device, including: providing a substrate; forming a conductive layer on a substrate; forming a patterned mask on the conductive layer, the pattering mask comprising an adhesion layer, wherein the adhesion layer has a first viscosity, and the patterned mask cover conductive layer partially; exposing a part of the patterned mask under an energy, wherein the adhesion layer of the patterned mask has a second viscosity; and removing the part of the patterned mask.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DESCRIPTION OF THE EMBODIMENTS

Figure 1A:
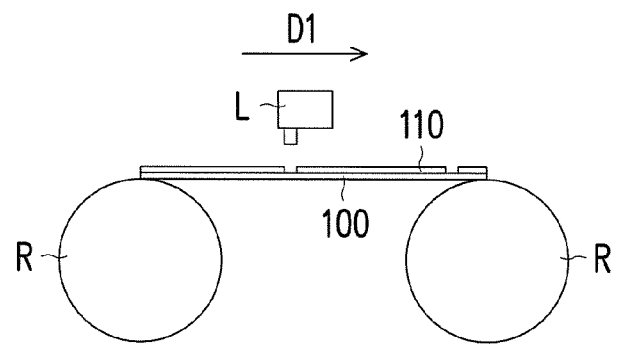
FIG. 1A through FIG. 1F schematically illustrate a method for fabricating an organic electro-luminescence device in accordance with a first embodiment.

Reference will now be made in detail to the present preferred embodiments of the disclosure, examples of which are illustrated in the accompanying drawings.

Wherever possible, the same reference numbers are used in the drawings and the description to refer to the same or like parts.

First Embodiment

FIG. 1A through FIG. 1F schematically illustrate a method for fabricating an organic electro-luminescence device in accordance with a first embodiment. FIG. 2A through FIG. 2F are top views or bottom views of the method for fabricating an organic electro-luminescence device in accordance with the first embodiment. FIG. 3A through FIG. 3F are cross-sectional views along the cross-section I-I' in FIG. 2A through FIG. 2F.

Figure 2A:
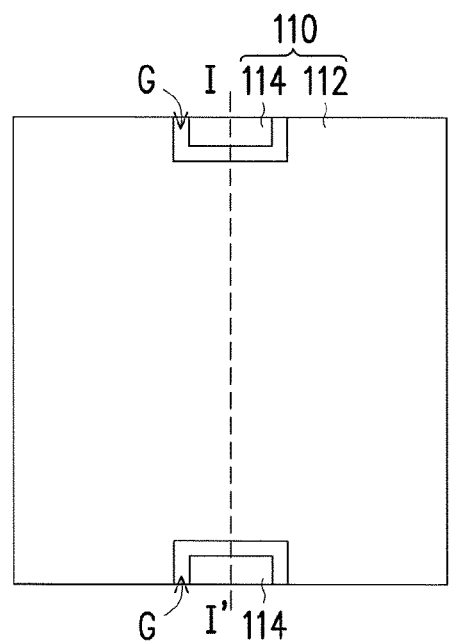
FIG. 2A through FIG. 2F are top views or bottom views of the method for fabricating an organic electro-luminescence device in accordance with the first embodiment.
Figure 3A:
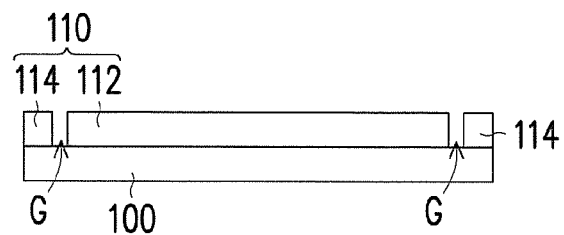
FIG. 3A through FIG. 3F are cross-sectional views along the cross-section I-I' in FIG. 2A through FIG. 2F.

Referring to FIG. 1A, FIG. 2A and FIG. 3A, a roll-to-roll apparatus including a plurality of rollers R are provided. The rollers R are capable of conveying a substrate 100 along a transmission direction D1. In this embodiment, the substrate 100 is provided with a first conductive layer 110 formed thereon. The substrate 100 is an ultra-thin (e.g. less than 100 micrometers) and flexible glass substrate. However, the material of the substrate 100 is not limited thereto. The first conductive layer 110 comprises a first electrode 112 and at least one contact pattern 114 electrically insulated from the first electrode 112. As shown in FIG. 2A and FIG. 3A, in this embodiment, two contact patterns 114 are formed at two opposite sides of the first electrode 112. It is noted that the shape and the number of the contact patterns 114 are not limited in this embodiment.

For instance, a method for fabricating the first electrode 112 and the contact patterns 114 may comprises the following steps. First, a transparent conductive oxide (TCO) layer is formed over the substrate 100 through sputtering, for example. Then, the TCO layer is patterned through laser irradiation provided by a laser light source L, for example. After the TCO layer is patterned, the first electrode 112 may comprise two notches and the contact patterns 114 are located in the notches. As shown in FIG. 2A and FIG. 3A, after the TCO layer is patterned, a gap G exists between the first electrode 112 and each contact pattern 114 such that the contact patterns 114 are capable of being electrically insulated from the first electrode 112.

Figure 1B:
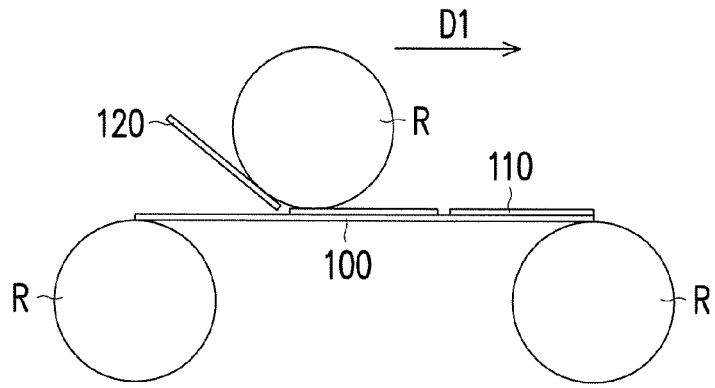
Figure 2B:
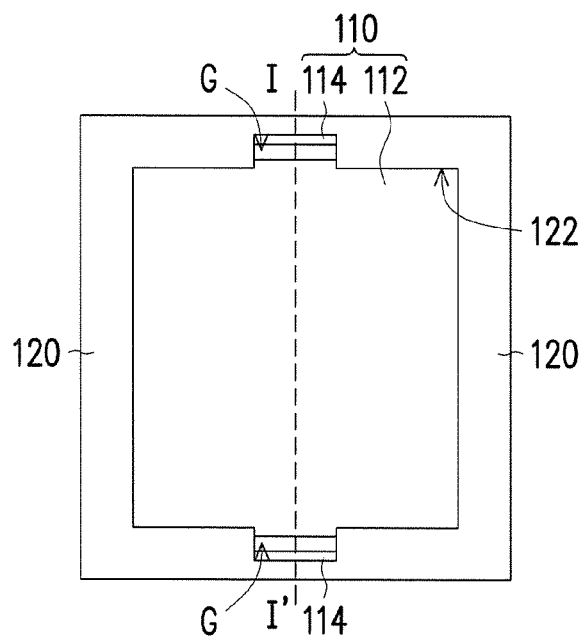
Figure 3B:
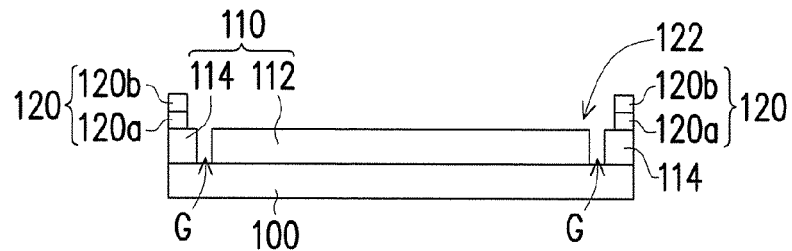

Referring to FIG. 1B, FIG. 2B and FIG. 3B, after the first electrode 112 and the contact patterns 114 are formed over the substrate 100, a first mask 120 is formed on the first conductive layer 110. The first mask 120 comprises an opening 122 for exposing a portion of the first electrode 112 and a portion of the contact patterns 114. The gap G between the first electrode 112 and each contact pattern 114 is partially exposed by the opening 122 of the first mask 120. As shown in FIG. 2B and FIG. 3B, a portion of the gap G between the first electrode 112 and each contact pattern 114 is filled and covered by the first mask 120. Furthermore, a peripheral area of the first electrode 112 and a portion of each contact pattern 114 are covered by the first mask 120. In other words, a central area of the first electrode 112 is exposed by the opening 122 of the first mask 120.

As shown in FIG. 1B, FIG. 2B and FIG. 3B, in some embodiments, the first mask 120 includes an adhesion film 120a and a release film 120b stacked on the adhesion film 120a. In order to ensure the adhesion between the first mask 120 and the first conductive layer 110, the viscosity of the adhesion film 120a of the first mask 120 may be substantially equal to or greater than 2000 g/inch on Steel Use Stainless (SUS). The adhesion film 120a of the first mask 120 may include a thermal curable material, an UV curable material or other suitable materials. In some embodiments, the adhesion film 120a includes thermal curable material, the adhesion film 120a is thermally cured under about 90 Celsius degree to about 130 Celsius degree, and the viscosity of the adhesion film 120a decreases accordingly. In some alternative embodiments, the adhesion film 120a includes an UV curable material, the adhesion film 120a is optically cured by UV light under about 45 Celsius degree for 30 seconds to 60 seconds, and the viscosity of the adhesion film 120a decreases accordingly. In some embodiments, the irradiation illuminance of the UV light may be greater than 200 mJ/cm$^2$, the wavelength of the UV light ranges from about 350 nm to about 420 nm, and the maximum peak of the UV light is about 365 nm.

In some embodiments, after the first mask 120 is adhered onto the first conductive layer 110, a cleaning process (e.g. brushing, air knife, water knife, ultrasonic oscillation, and so on) may be performed to remove or reduce the particles on the first conductive layer 110 and/or substrate 100. Since the viscosity of the adhesion film 120a is substantially equal to or greater than 2000 g/inch on Steel Use Stainless (SUS), the adhesion between the first mask 120 and the first conductive layer 110 is sufficient to prevent the first mask 120 from delaminating or peeling. It is noted that the above-mentioned cleaning process does not deteriorate the viscosity of the adhesion film 120a and the adhesion between the first conductive layer 110 and the first mask 120.

When the viscosity of the adhesion film 120a is substantially equal to or greater than 2000 g/inch, the cleaning process with strong cleaning capability can be used, and after the cleaning process is performed, in an effective square area (20 cm×20 cm) of the substrate 100 and the first conductive layer 110, less than 300 particles having diameter greater than 0.3 micrometer remain.

After performing the cleaning process, the viscosity of the adhesion film 120a may decrease by thermal treatment (temperature raising, cooling processes and so on), ultraviolet (UV) irradiation, water bath, the combinations thereof or other suitable process. After performing the cleaning process, the viscosity of the adhesion film 120a may decrease from about 2000 g/inch (i.e. first viscosity) to about or less than 20 g/inch (i.e. second viscosity) by thermal treatment, UV irradiation, water bath, the combinations thereof or other suitable process, for example. After the viscosity of the adhesion film 120a decreases, the first mask 120 can be de-bonded or removed from the first conductive layer 110 easily during the follow-up processes (e.g. the process shown in FIG. 1E, FIG. 2E and FIG. 3E). In some embodiments, the ration between the first viscosity and the second viscosity is more than 100.

Figure 1C:
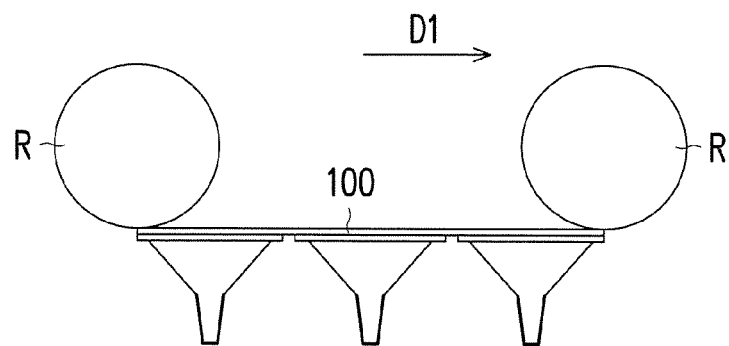
Figure 2C:
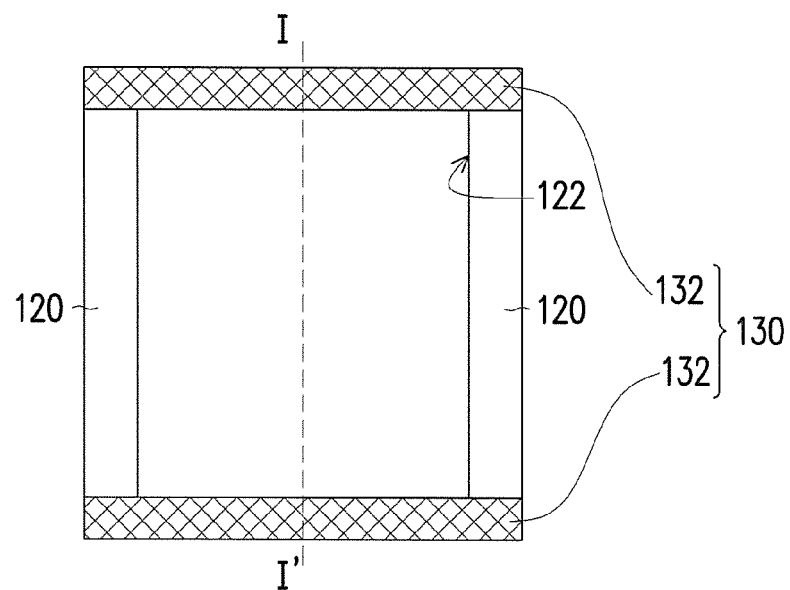
Figure 3C:
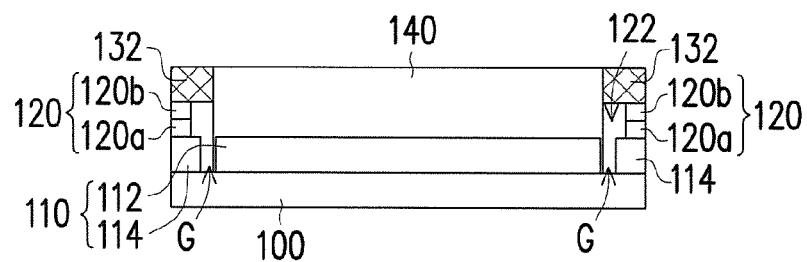

Referring to FIG. 1C, FIG. 2C and FIG. 3C, a second mask 130 is provided over the first mask 120 so as to shield the portion of each contact pattern 114 exposed by the opening 122 of the first mask 120. In other words, the contact patterns 114 and the gaps G are covered and shielded by the second mask 130. Beside, portions of the first mask 120 are uncovered and exposed by the second mask 130. As shown in FIG. 2B, the first mask 120 is a frame mask having the opening 122, the second mask 130 comprises at least one pair of shielding strips 132, and a lengthwise direction of the shielding strips 132 is parallel to the transmission direction D1. In this embodiment, the second mask 130 is provided over and in contact with the first mask 120, and the second mask 130 is not in contact with the first conductive layer 110, for example.

After the second mask 130 is provided, an evaporation process is, for example, performed to form a patterned organic functional layer 140 by shielding of a second mask 130. The patterned organic functional layer 140 covers the portions of the first mask 120 that are exposed by the second mask 130 and the central area of the first electrode 112 that is exposed by the opening 122 of the first mask 120.

In some embodiments, before providing the second mask 130 over the first mask 120, the viscosity of the first mask 120 may decrease by thermal treatment, ultraviolet (UV) irradiation, water bath, the combinations thereof or other suitable process.

In some alternative embodiments, after providing the second mask 130 over the first mask 120 (e.g. the processes illustrated in FIG. 1C, FIG. 2C, FIG. 3C, FIG. 1D, FIG. 2D, and FIG. 3D), the viscosity of the first mask 120 may decrease by thermal treatment, ultraviolet (UV) irradiation, water bath, the combinations thereof or other suitable process.

As shown in FIG. 2C, since the second mask 130 is not in contact with the first conductive layer 110, the evaporated patterned organic functional layer 140 may cover sidewalls of the first electrode 112 that are exposed by the opening 122 of the first mask 120. In other words, the patterned organic functional layer 140 may extend into the gaps G so as to encapsulate sidewalls and a top surface of the first electrode 112 that are exposed by the opening 122 of the first mask 120.

Figure 1D:
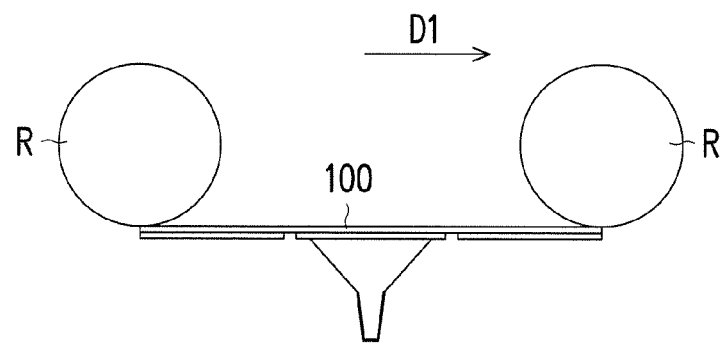
Figure 2D:
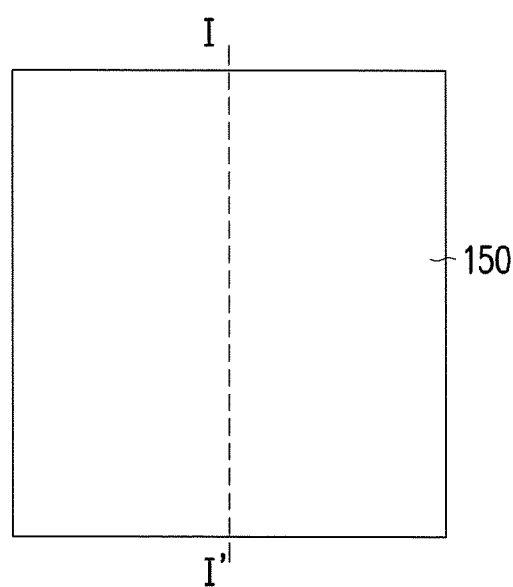
Figure 3D:
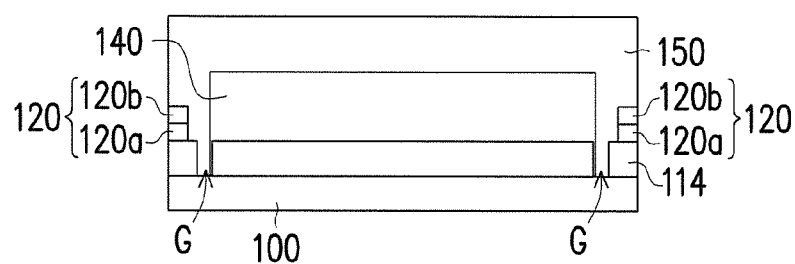

Referring to FIG. 1D, FIG. 2D and FIG. 3D, after forming the patterned organic functional layer 140, the substrate 100 comprising the first conductive layer 110, the first mask 120 and the patterned organic functional layer 140 formed thereon is conveyed along the transmission direction D1, and the second mask 130 is removed. Then, a second conductive layer 150 is formed over the patterned organic functional layer 140, the first mask 120 and the contact pattern 114 exposed by the opening 122 of the first mask 120. In this embodiment, the second conductive layer 150 is formed by evaporation process.

As shown in FIG. 3D, first electrode 112 and the second conductive layer 150 are spaced apart by the patterned organic functional layer 140, since the patterned organic functional layer 140 extends into the gaps G so as to encapsulate sidewalls and a top surface of the first electrode 112 that are exposed by the opening 122 of the first mask 120. In other words, the patterned organic functional layer 140 may prevents short circuit between the first electrode 112 and the second conductive layer 150.

Figure 1E:
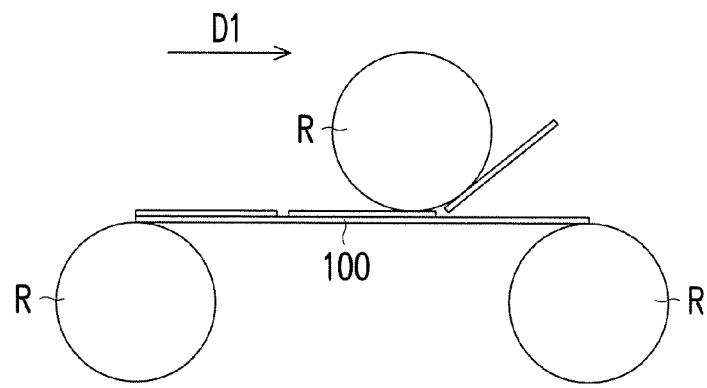
Figure 2E:
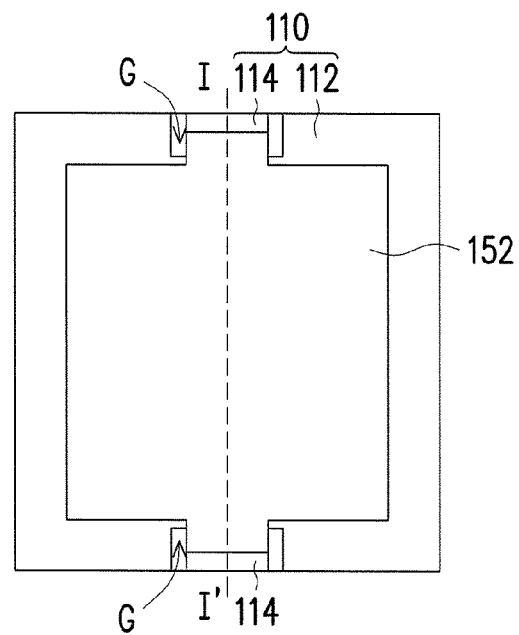
Figure 3E:
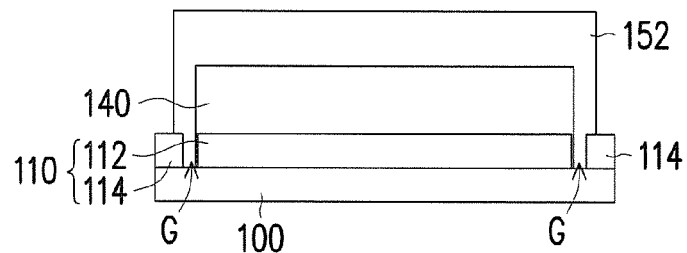

Referring to FIG. 1E, FIG. 2E and FIG. 3E, after the second conductive layer 150 is formed, the second conductive layer 150 is patterned by removing the first mask 120 and a portion of the second conductive layer 150 on the first mask 120 so as to form a second electrode 152. The second electrode 152 is electrically connected to the contact patterns 114 and is spaced apart from the first electrode 112 by the patterned organic functional layer 140. After the second electrode 152 is formed, fabrication of the organic electroluminescence device of this embodiment is about accomplished. The fabrication process is not limited in fabrication of the organic electro-luminescence device, and the fabrication process may be used in fabrication of other flexible electronic devices.

Figure 1F:
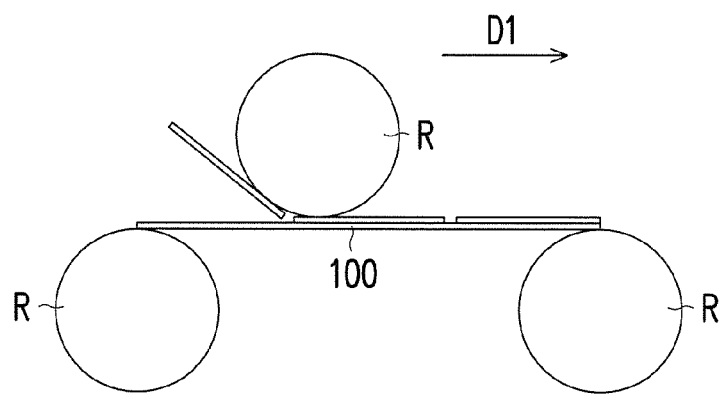
Figure 2F:
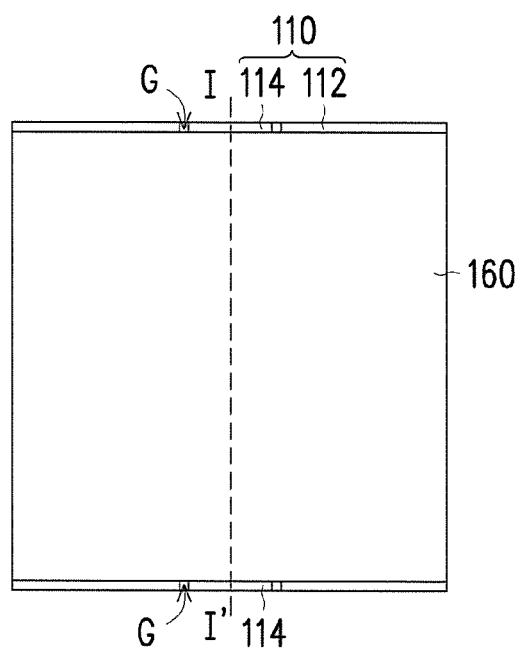
Figure 3F:
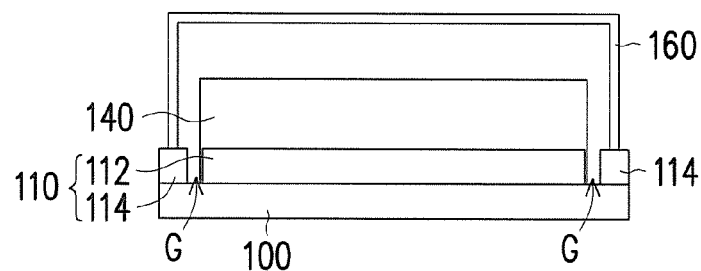

Referring to FIG. 1F, FIG. 2F and FIG. 3F, in order to enhance reliability of the organic electro-luminescence device, an encapsulation 160 may be formed to encapsulate the second electrode 152. In some embodiments, the encapsulation 160 may further encapsulate a portion of the contact patterns 114.

It is noted that deviation of the substrate 100 along a direction D2 perpendicular to the transmission direction D often occurs when the substrate 100 is conveyed along the transmission direction D1. Such deviation of the substrate 100 may cause mis-alignment between stacked layers of the organic electro-luminescence devices. Since first mask 120 is formed over the substrate 100, the first mask 120 can minimize the above-mentioned mis-alignment issue in the directions D and D2.

Second Embodiment

FIG. 4A through FIG. 4I schematically illustrate a method for fabricating an organic electro-luminescence device in accordance with a second embodiment. FIG. 5A through FIG. 5I are top views or bottom views of the method for fabricating an organic electro-luminescence device in accordance with the second embodiment. FIG. 6A through FIG. 6I are cross-sectional views along the cross-section I-I' in FIG. 5A through FIG. 5I.

Figure 4A:
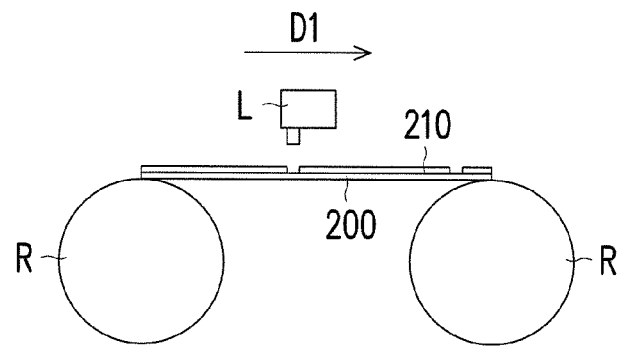
FIG. 4A through FIG. 4I schematically illustrate a method for fabricating an organic electro-luminescence device in accordance with a second embodiment.
Figure 5A:
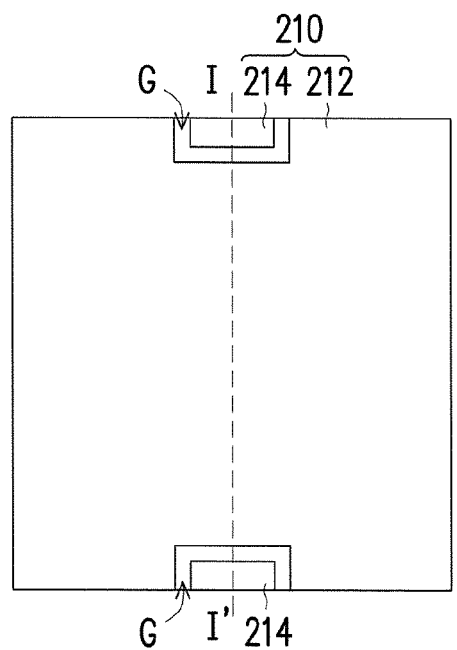
FIG. 5A through FIG. 5I are top views or bottom views of the method for fabricating an organic electro-luminescence device in accordance with the second embodiment.
Figure 6A:
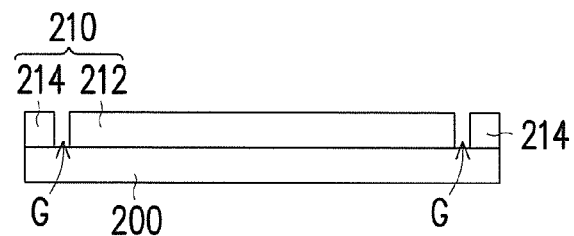
FIG. 6A through FIG. 6I are cross-sectional views along the cross-section I-I' in FIG. 5A through FIG. 5I.

Referring to FIG. 4A, FIG. 5A and FIG. 6A, a roll-to-roll apparatus including a plurality of rollers R are provided. The rollers R are capable of conveying a substrate 200 along a transmission direction D1. In this embodiment, the substrate 200 is provided with a first conductive layer 210 formed thereon. The substrate 200 is an ultra-thin (e.g. less than 100 micrometers) and flexible glass substrate. However, the material of the substrate 200 is not limited thereto. The first conductive layer 210 comprises a first electrode 212 and at least one contact pattern 214 electrically insulated from the first electrode 212. As shown in FIG. 5A and FIG. 6A, in this embodiment, two contact patterns 214 are formed at two opposite sides of the first electrode 212. It is noted that the shape and the number of the contact patterns 214 are not limited in this embodiment.

For instance, a method for fabricating the first electrode 212 and the contact patterns 214 may comprises the following steps. First, a transparent conductive oxide (TCO) layer is formed over the substrate 200 through sputtering, for example. Then, the TCO layer is patterned through laser irradiation provided by a laser light source L, for example. After the TCO layer is patterned, the first electrode 212 may comprise two notches and the contact patterns 214 are located in the notches. As shown in FIG. 2A and FIG. 3A, after the TCO layer is patterned, a gap G exists between the first electrode 212 and each contact pattern 214 such that the contact patterns 214 are capable of being electrically insulated from the first electrode 212.

Figure 4B:
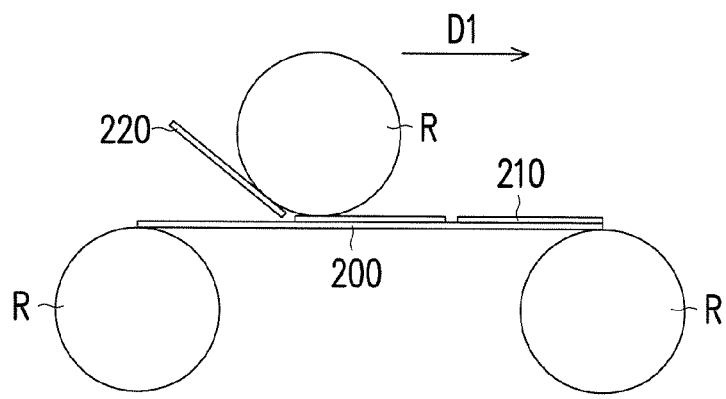
Figure 5B:
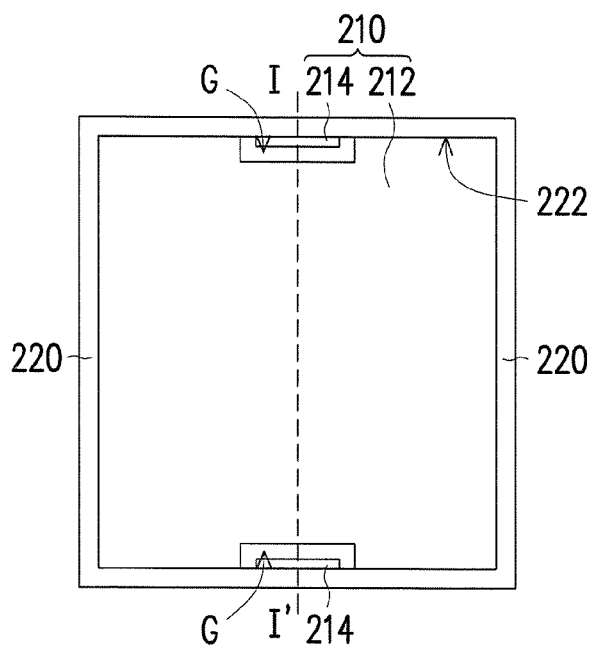
Figure 6B:
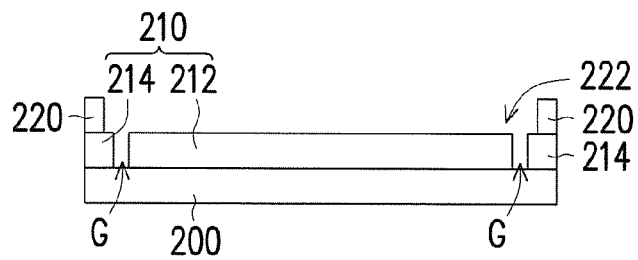

Referring to FIG. 4B, FIG. 5B and FIG. 6B, after the first electrode 212 and the contact patterns 214 are formed over the substrate 200, a mask 220 (i.e. a third mask 220) for defining sequentially formed encapsulation is formed on the first conductive layer 210. The third mask 220 comprises a third opening 222 for exposing a portion of the first electrode 212 and a portion of the contact patterns 214. The gap G between the first electrode 212 and each contact pattern 214 is partially exposed by the third opening 222 of the third mask 220. As shown in FIG. 5B and FIG. 6B, a portion of the gap G between the first electrode 212 and each contact pattern 214 is filled and covered by the third mask 220. Furthermore, a peripheral area of the first electrode 212 and a portion of each contact pattern 214 are covered by the third mask 220. In other words, a central area of the first electrode 212 is exposed by the third opening 222 of the third mask 220. It is noted that formation of the third mask 220 is optional in this embodiment.

It is noted that the mask 220 (i.e. the third mask 220) mentioned in this embodiment may have substantially the same structure and characteristics as the first mask 120 shown in the first embodiments, and the detail description of the mask 220 of this embodiment is thus omitted.

Figure 4C:
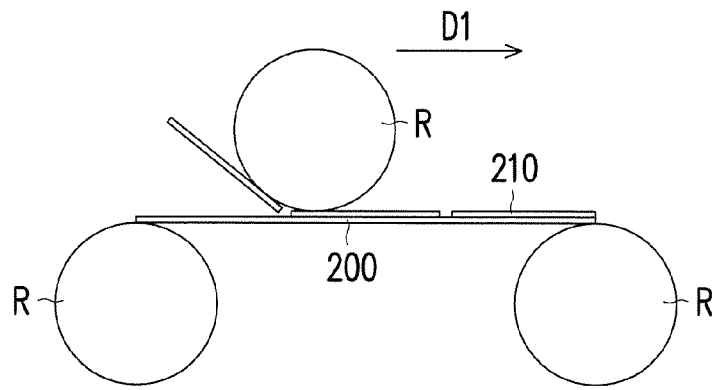
Figure 5C:
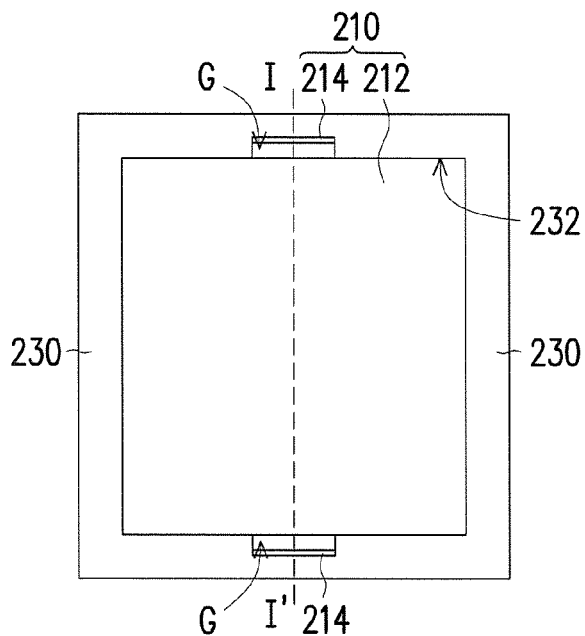
Figure 6C:
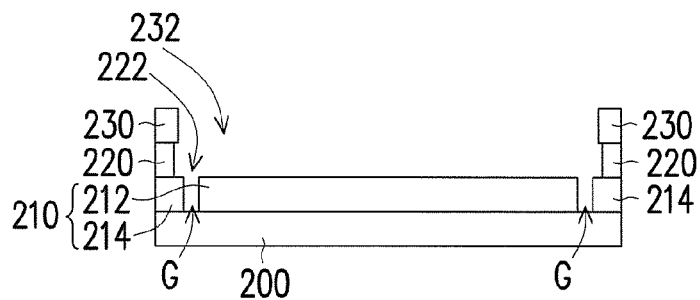

Referring to FIG. 4C, FIG. 5C and FIG. 6C, a first mask 230 is then formed over the first conductive layer 210. In this embodiment, the first mask 230 is formed on the third mask 220. The first mask 230 comprises a first opening 232 for exposing a portion of the first electrode 212 and a portion of the contact patterns 214, wherein the first opening 232 of the first mask 230 is smaller than the third opening 222 of the third mask 220. The gap G between the first electrode 212 and each contact pattern 214 is partially exposed by the third opening 222 of the third mask 220.

It should be noted that formation of the third mask 220 is optional in this embodiment. When the formation of the third mask 220 is omitted (i.e. the first mask 230 is formed on and in contact with the first conductive layer 210), a portion of the gap G between the first electrode 212 and each contact pattern 214 is filled and covered by the first mask 230. Furthermore, a peripheral area of the first electrode 212 and a portion of each contact pattern 214 are covered by the first mask 230. In other words, a central area of the first electrode 212 is exposed by the first opening 232 of the first mask 230.

Figure 4D:
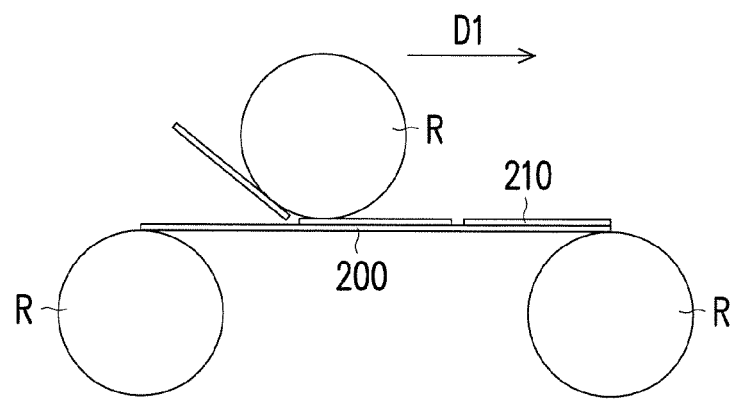
Figure 5D:
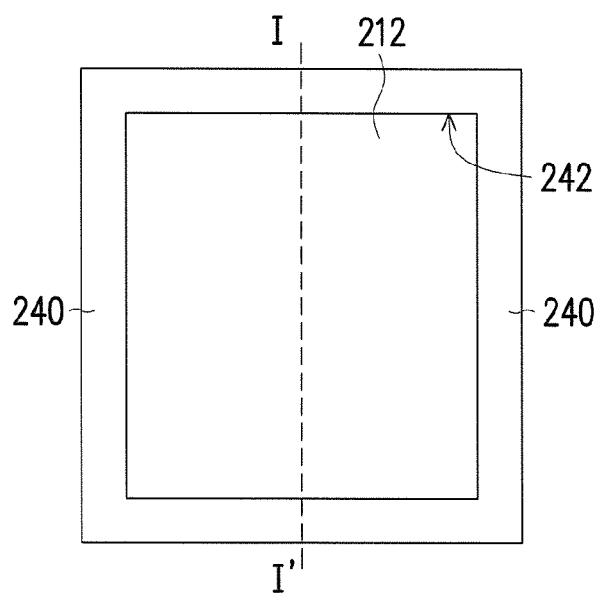
Figure 6D:
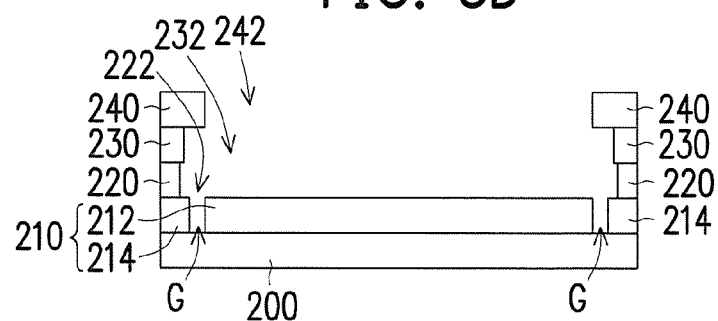

Referring to FIG. 4D, FIG. 5D and FIG. 6D, a second mask 240 is formed on the first mask 230, wherein the second mask 240 comprises a second opening 242, the second mask 240 shields the contact patterns 214 exposed by the first opening 232 of the first mask 230, and a portion of the first electrode 212 is exposed by the second opening 242. As shown in FIG. 5D and FIG. 6D, the second opening 242 of the second mask 240 is smaller than the first opening 232 of the first mask 230. In this embodiment, the first mask 230, the second mask 240 and the third mask 220 are frame masks having openings in different sizes. In this embodiment, the second mask 240 is provided over and in contact with the first mask 230, and the second mask 240 is not in contact with the first conductive layer 210, for example.

Figure 4E:
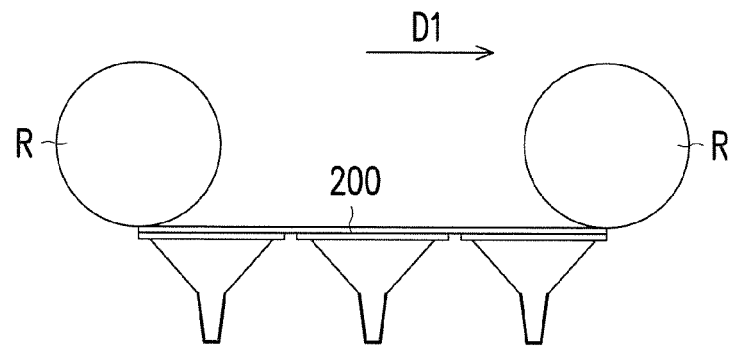
Figure 5E:
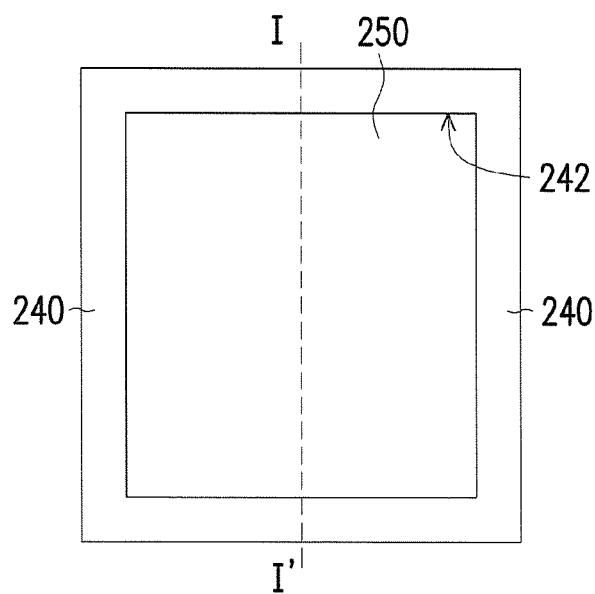
Figure 6E:
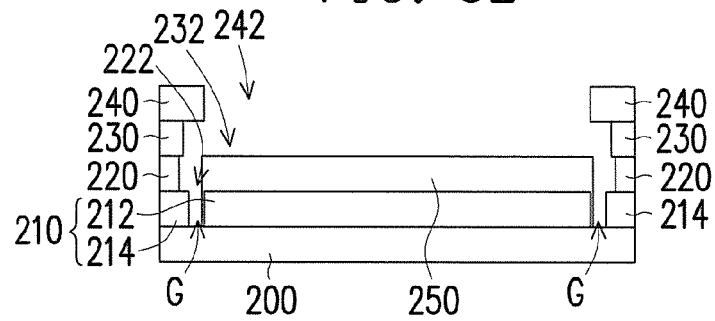

Referring to FIG. 4E, FIG. 5E and FIG. 6E, after the second mask 240 is provided, a cleaning process (e.g. brushing, air knife, water knife, ultrasonic oscillation, and so on) may be performed to remove or reduce the particles on the first conductive layer 210 and/or substrate 200. Since the adhesion between third mask 220 and the first electrode 212, the adhesion between the third mask 220 and the first mask 230, and the adhesion between the first mask 230 and the second mask 240 are substantially equal to or greater than 2000 g/inch, the stacked structure including the first electrode 212, the third mask 220, first mask 230 and the second mask 240 is strong enough and may not delaminate or peel from the substrate 200. It is noted that the above-mentioned cleaning process does not deteriorate the adhesion interfaces between the first electrode 212, the third mask 220, first mask 230 and the second mask 240.

When the adhesion between the first electrode 212 and the third mask 220, the adhesion between the third mask 220 and the first mask 230, the adhesion between the first mask 230 and the second mask 240 are substantially equal to or greater than 2000 g/inch, the cleaning process with strong cleaning capability can be used, and after the cleaning process is performed, in an effective square area (20 cm×20 cm) of the substrate 200 and the first conductive layer 210, less than 300 particles having diameter greater than 0.3 micrometer remain.

After performing the cleaning process, the adhesion between the first electrode 212 and the third mask 220, the adhesion between the third mask 220 and the first mask 230, the adhesion between the first mask 230 and the second mask 240 may be decreased by thermal treatment (temperature raising, cooling processes and so on), ultraviolet (UV) irradiation, water bath, the combinations thereof or other suitable process. After performing the cleaning process, the adhesion between the first electrode 212 and the third mask 220, the adhesion between the third mask 220 and the first mask 230, the adhesion between the first mask 230 and the second mask 240 may be decreased from about 2000 g/inch to about or less than 20 g/inch by thermal treatment, UV irradiation, water bath, the combinations thereof or other suitable process, for example. After the adhesion between the first electrode 212 and the third mask 220, the adhesion between the third mask 220 and the first mask 230, the adhesion between the first mask 230 and the second mask 240 being decreased, the third mask 220, first mask 230 and the second mask 240 can be de-bonded or removed from the underlying layer(s) easily during the follow-up processes.

After the cleaning process is performed, an evaporation process is, for example, performed to form a patterned organic functional layer 250 by shielding of the second mask 240. The evaporated patterned organic functional layer 250 covers the central area of the first electrode 212 that is exposed by the second opening 242 of the second mask 240 and the first opening 232 of the first mask 230.

As shown in FIG. 5E, since the second mask 240 is not in contact with the first conductive layer 210, the evaporated patterned organic functional layer 250 may cover sidewalls of the first electrode 212 that are exposed by the first opening 232, the second opening 242 and the third opening 222. In other words, the patterned organic functional layer 250 may extend into the gaps G so as to encapsulate sidewalls and a top surface of the first electrode 212.

Figure 4F:
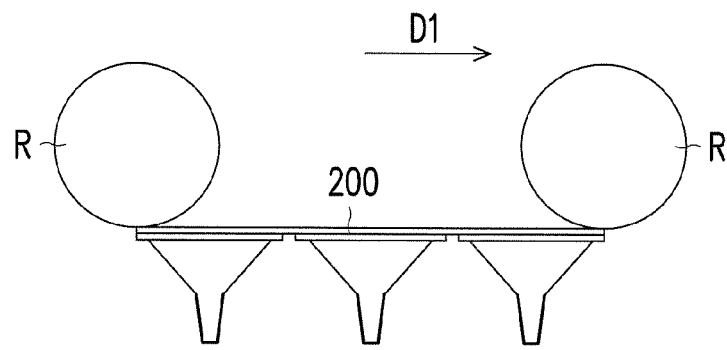
Figure 5F:
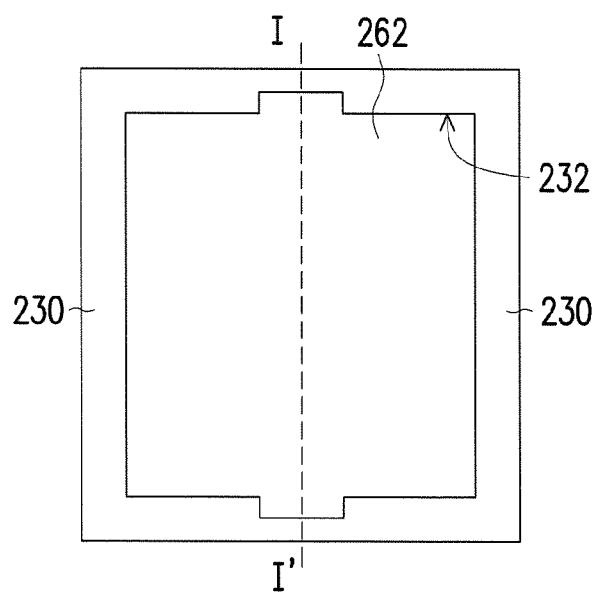
Figure 6F:
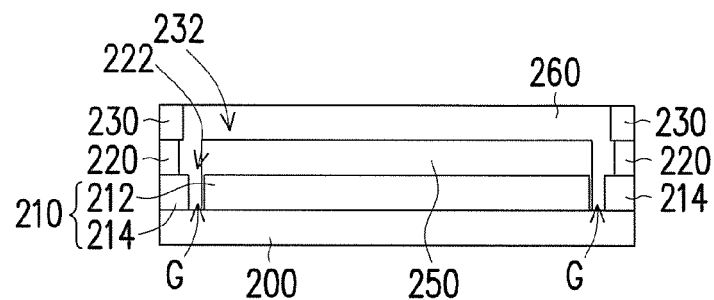

Referring to FIG. 4F, FIG. 5F and FIG. 6F, after forming the patterned organic functional layer 250, the second mask 240 is removed. In order to remove the second mask 240, the adhesion between the first mask 230 and the second mask 240 is required to be smaller than the adhesion between the first mask 230 and the third mask 220 after the third mask 220, first mask 230 and the second mask 240 are treated by the aforesaid thermal treatment, UV irradiation, water bath, the combinations thereof or other suitable process. Then, a second conductive layer 260 is formed over the patterned organic functional layer 250, the first mask 230 and a portion of the contact pattern 214. In this embodiment, the second conductive layer 260 is formed by evaporation process, for example.

As shown in FIG. 6F, since the patterned organic functional layer 250 extends into the gaps G so as to encapsulate sidewalls and a top surface of the first electrode 212 which are exposed by the first opening 232 of the first mask 230, the first electrode 212 and the second conductive layer 260 are spaced apart by the patterned organic functional layer 250. In other words, the patterned organic functional layer 250 may prevents short circuit between the first electrode 212 and the second conductive layer 260.

Figure 4G:
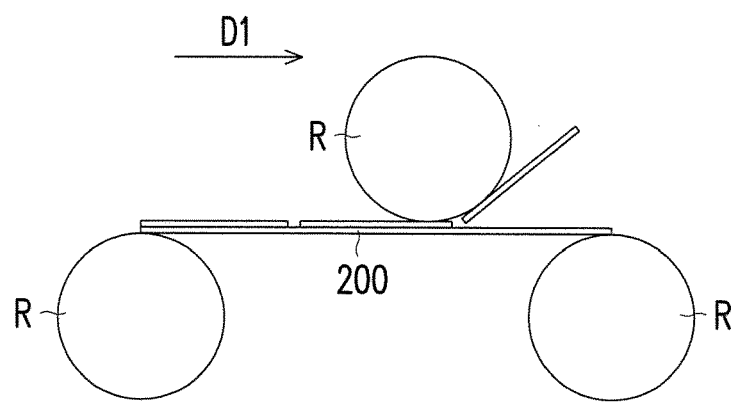
Figure 5G:
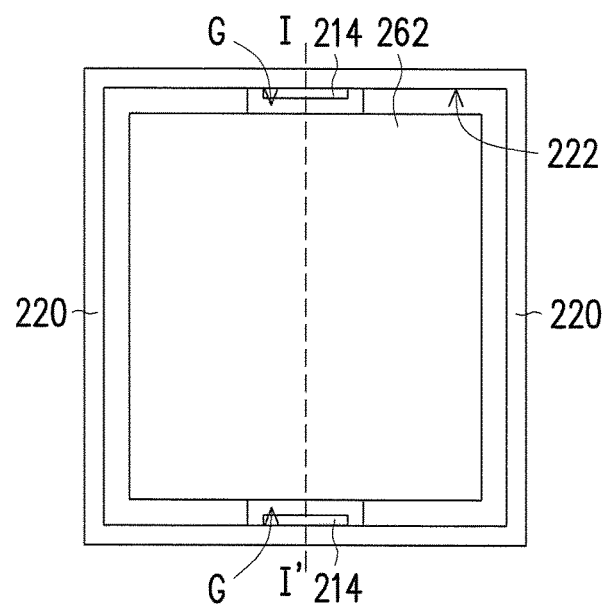
Figure 6G:
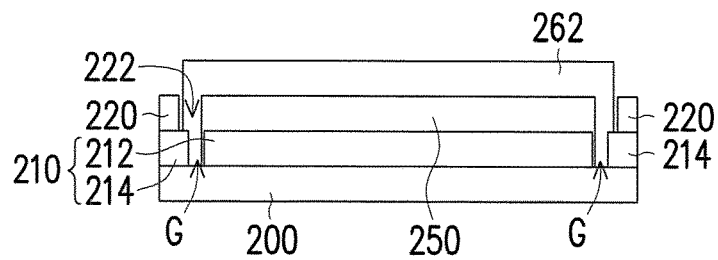
Figure 4H:
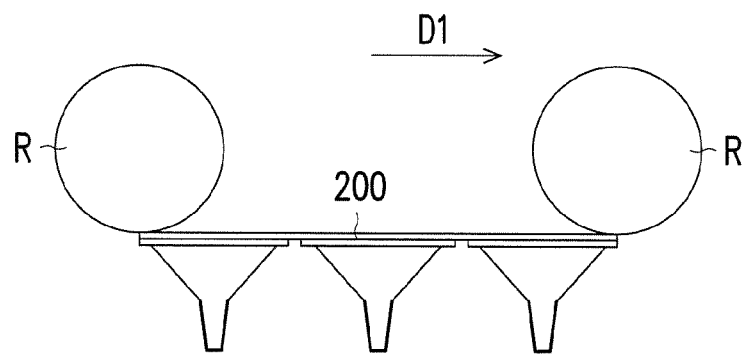
Figure 5H:
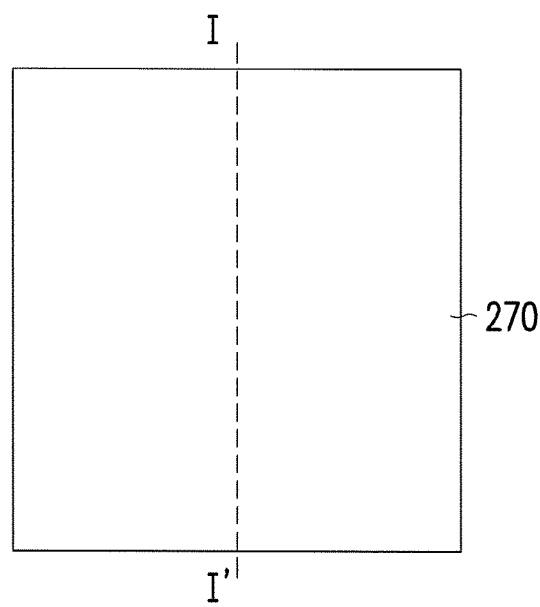
Figure 6H:
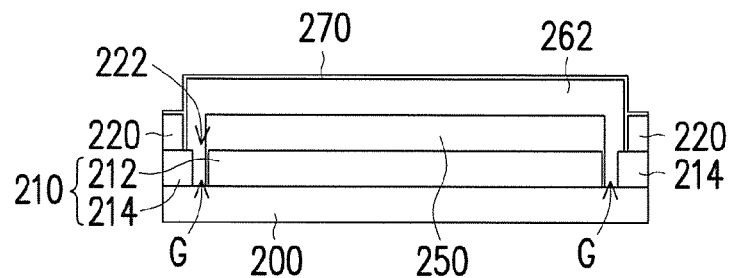
Figure 4I:
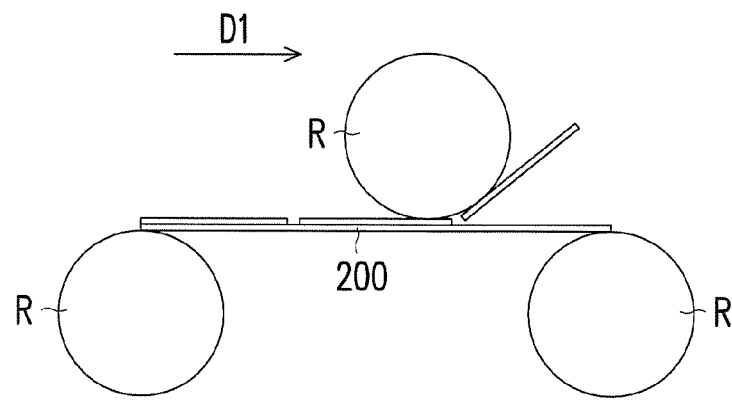
Figure 5I:
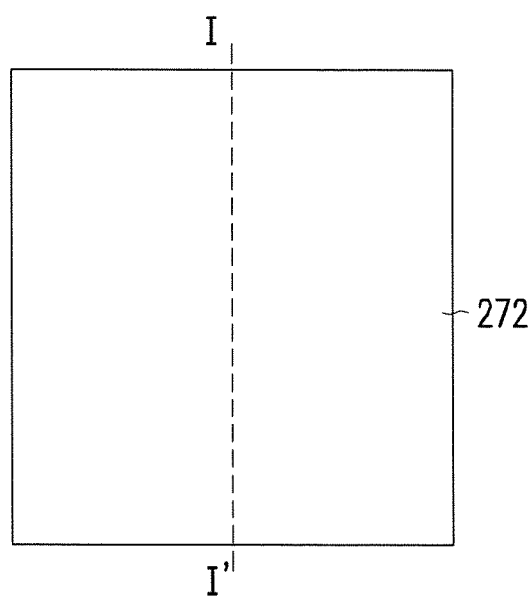
Figure 6I:
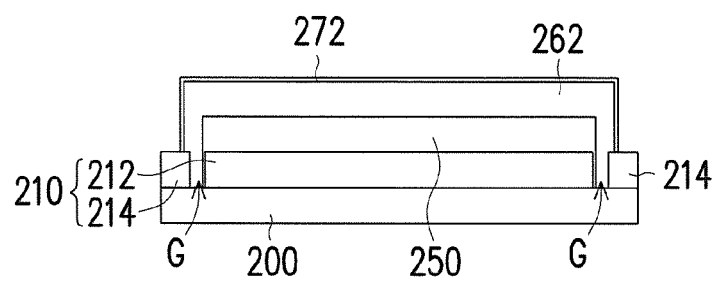

Referring to FIG. 4G, FIG. 5G and FIG. 6G, after forming the second conductive layer 260, the second conductive layer 260 is patterned by removing the first mask 230 and a portion of the second conductive layer 260 on the first mask 230 so as to form a second electrode 262. In order to remove the first mask 230, the adhesion between the first mask 230 and the third mask 220 is required to be smaller than the adhesion between the third mask 220 and the first conductive layer 210 after the third mask 220, first mask 230 and the second mask 240 are treated by the aforesaid thermal treatment, UV irradiation, water bath, the combinations thereof or other suitable process. The second electrode 262 is electrically connected to the contact patterns 214 and is spaced apart from the first electrode 212 by the patterned organic functional layer 250. After the second electrode 262 is formed, fabrication of the organic electro-luminescence device of this embodiment is about accomplished.

Referring to FIGS. 4H-4I, FIGS. 5H-5I and FIGS. 6H-6I, in order to enhance reliability of the organic electro-luminescence device, an encapsulation material layer 270 may be formed to cover the third mask 220, a portion area of the contact patterns 214 and the second electrode 262. Then, the encapsulation material layer 270 is patterned by removing the third mask 220 and a portion of the encapsulation material layer 270 on the third mask 220 so as to form an encapsulation 272.

In the aforesaid embodiments, it is noted that deviation of the substrate (100, 200) along a direction D2 perpendicular to the transmission direction D1 often occurs when the substrate (100, 200) is conveyed along the transmission direction D1. Such deviation of the substrate (100, 200) may cause mis-alignment between stacked layers of the organic electro-luminescence devices. Since the first mask (120, 230), the second mask (130, 240) and the third mask 220 are formed over the substrate (100, 200), the aforesaid first mask 230, the second mask (130, 240) and the third mask 220 can minimize the above-mentioned mis-alignment issue in the directions D1 and D2.

In this disclosure, the mask formed on the substrate can effectively resolve alignment issue of stacked layers in the organic electro-luminescence devices, and thus enhance yield rate of mass production of the organic electro-luminescence devices.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims and their equivalents.

What is claimed is:

1. A method for fabricating an organic electro-luminescence device, comprising:
   forming a first conductive layer on a substrate, the first conductive layer comprising a first electrode and a contact pattern electrically insulated from the first electrode;
   forming a first mask on the first conductive layer, the first mask comprising an opening for exposing a portion of the first electrode and a portion of the contact pattern, and a viscosity of an adhesion film of the first mask being substantially equal to or greater than 2000 g/inch;
   forming a patterned organic functional layer by shielding of a second mask, the patterned organic functional layer covering the first mask and the first electrode exposed by the first mask, and the second mask being disposed over the first mask to shield the portion of the contact pattern exposed by the opening;
   removing the second mask after forming the patterned organic functional layer;
   forming a second conductive layer over the patterned organic functional layer, the first mask and the contact pattern exposed by the opening; and
   patterning the second conductive layer by removing the first mask and a portion of the second conductive layer on the first mask to form a second electrode electrically connected to the contact pattern.

2. The method according to claim 1, wherein the first electrode comprises a notch and the contact pattern is located in the notch.

3. The method according to claim 2, wherein a gap is between the first electrode and the contact pattern.

4. The method according to claim 3, wherein the gap is partially exposed by the opening of the first mask and is shielded by the second mask.

5. The method according to claim 1, wherein the first electrode and the second electrode are spaced apart by the patterned organic functional layer.

6. The method according to claim 1, wherein the substrate is conveyed along a transmission direction to form the first electrode, the contact pattern, the first mask, the patterned organic functional layer and the second electrode on the substrate.

7. The method according to claim 6, wherein the first mask or the second mask is a frame mask.

8. The method according to claim 6, wherein the second mask comprises at least one pair of shielding strips, and a lengthwise direction of the shielding strips is parallel to the transmission direction.

9. The method according to claim 1 further comprising:
   forming an encapsulation to encapsulate the second electrode.

10. The method according to claim 1, wherein the first mask further comprises a release film stacked on the adhesion film.

11. The method according to claim 1 further comprising:
   cleaning the first conductive layer on the substrate after forming the first mask being formed on the first conductive layer; and
   decreasing the viscosity of the adhesion film of the first mask after cleaning the first conductive layer on the substrate.

12. The method according to claim 11, wherein the viscosity of the adhesion film of the first mask is decreased to equal to or less than 20 g/inch after cleaning the first conductive layer on the substrate.

13. A method for fabricating an organic electro-luminescence device, comprising:
   forming a first conductive layer on a substrate, the first conductive layer comprising a first electrode and a contact pattern electrically insulated from the first electrode;
   forming a first mask over the first conductive layer, the first mask comprising a first opening for exposing a portion of the first electrode and a portion of the contact pattern;
   forming a second mask on the first mask, the second mask comprising a second opening, the second mask shielding the contact pattern exposed by the first opening, and the second opening exposing a portion of the first electrode, an adhesion between the first conductive layer and the first mask and an adhesion between the first mask and the second mask being substantially equal to or greater than 2000 g/inch;
   performing a cleaning process on the substrate having the first conductive layer, the first mask and the second mask formed thereon;

forming a patterned organic functional layer on the first electrode by shielding of the second mask;

decreasing the adhesion between the first conductive layer and the first mask and the adhesion between the first mask and the second mask after performing the cleaning process;

removing the second mask after forming the patterned organic functional layer;

forming a second conductive layer over the patterned organic functional layer, the first mask and the contact pattern; and patterning the second conductive layer by removing the first mask and a portion of the second conductive layer on the first mask to form a second electrode electrically connected to the contact pattern.

14. The method according to claim 13 further comprising:

forming a third mask on the first conductive layer before the first mask is formed, the third mask comprising a third opening for exposing a portion of the first electrode and a portion of the contact pattern, wherein an adhesion between the third mask and the first mask and an adhesion between the third mask and the first conductive layer being substantially equal to or greater than 2000 g/inch;

decreasing the adhesion between the third mask and the first mask and the adhesion between the third mask and the first conductive layer after performing the cleaning process;

forming an encapsulation material layer over the second electrode and the third mask; and patterning the encapsulation material layer by removing the third mask and a portion of the encapsulation material layer on the third mask to form an encapsulation.

15. The method according to claim 14, wherein the adhesion between the first mask and the second mask is smaller than the adhesion between the first mask and the third mask after the adhesion between the first mask and the second mask and the adhesion between the first mask and the third mask are decreased.

16. The method according to claim 14, wherein the adhesion between the first mask and the third mask is smaller than the adhesion between the third mask and the first conductive layer after the adhesion between the first mask and the third mask and the adhesion between the third mask and the first conductive layer are decreased.

17. A method for fabricating a flexible electric device, comprising:

providing a substrate;

forming a conductive layer on a substrate;

forming a patterned mask on the conductive layer, the pattering mask comprising an adhesion layer, wherein the patterned mask cover conductive layer partially;

forming a patterned film on portions of the conductive layer exposed by the patterned mask;

exposing the adhesion layer of the patterned mask under an energy so as to decrease adhesion of the adhesion layer; and removing the patterned mask from the conductive layer.

18. The method according to claim 17, wherein the adhesion of the adhesion layer is first viscosity, the first viscosity is substantially equal to or greater than 2000 g/inch.

19. The method according to claim 17, wherein the adhesion of the adhesion layer under an energy is second viscosity, the second viscosity is substantially equal to or less than 20 g/inch.

20. The method according to claim 17, wherein a ration between the first viscosity and the second viscosity is more than 100.

21. The method according to claim 17, wherein the energy is provided by thermal treatment, UV irradiation, water bath, the combinations thereof.

* * * * *